(12) United States Patent
Markarian et al.

(10) Patent No.: US 6,611,940 B1
(45) Date of Patent: Aug. 26, 2003

(54) DECODING SYMBOLS REPRESENTING DIGITAL WORDS

(75) Inventors: Garegin Markarian, Chilworth (GB); Keith Pickavance, Romsey (GB)

(73) Assignee: Tandberg Television ASA, N-Lysaker (NO)

( * ) Notice: Subject to any disclaimer, the term of this patent is extended or adjusted under 35 U.S.C. 154(b) by 0 days.

(21) Appl. No.: 09/392,501

(22) Filed: Sep. 9, 1999

(30) Foreign Application Priority Data

Sep. 10, 1998 (GB) .............................................. 9819689

(51) Int. Cl.[7] .............................................. G06F 11/10
(52) U.S. Cl. ........................ 714/790; 714/755; 714/800
(58) Field of Search ................................ 714/790, 755, 714/800

(56) References Cited

U.S. PATENT DOCUMENTS 6,163,571 A * 12/2000 Asokan et al.
6,236,685 B1 * 5/2001 Oppedahl

FOREIGN PATENT DOCUMENTS

| EP | 0526201 | 2/1993 |
|----|---------|--------|
| EP | 0577085 | 1/1994 |
| WO | 9737322 | 10/1997 |

OTHER PUBLICATIONS

Inspec Abstract No. B9608–6120B–049 & K. Fazel et al, IEEE Globecom '95 Conference, 1995, IEEE, USA, vol. 1, pp. 649–653 (see abstract).

Papke L. et al—Combined Multilevel Turbo–Code with Mr–Modulation, Proceedings of the Conference on Communications (ICC), US, New York? IEEE, p. 668–672 XPOOO533098 ISBN: 0–7803–2487–0 Nov. 14, 1995.

Fazel K. et al—Combined Multilevel Turbo–Code with 8PSK Modulation, IEEE Global Telecommunications Conference (Globecom), US, New York, IEEE, p. 649–653 XPOOO621563 ISBN: 0–7803–2510–9 Jun. 18, 1995.

Robertson P. et al—Coded Modulation Scheme Employing Turbo Codes, Electronics Letters, GB, IEE Stevenage, vol. 31, No. 18, p. 1546 1547XP000530944 ISSN: 0013–5194 Aug. 31, 1995.

* cited by examiner

Primary Examiner—Phung M. Chung
(74) Attorney, Agent, or Firm—Wildman Harrold Allen & Dixon (57) ABSTRACT

The present invention relates to a method and apparatus for decoding symbols each representing a digital word including a turbo encoded bit, a parity bit and at least one uncoded bit. A first soft metric generator produces a soft metric of the encoded bit in each symbol and one or more second soft metric generators generate a soft metric of the or each uncoded bit in each symbol. A turbo decoder decodes the soft metric of the encoder bit so as to produce a hard value and a soft estimate of the encoded bit. A turbo encoder encode the hard value of the encoded bit to produce a reconstruction of the encoded bit and two parity bits. A puncture module punctures the parity bits once. One or more hard decision modules produce a hard decision for the or each uncoded bit of each symbol.

8 Claims, 5 Drawing Sheets

DECODING SYMBOLS REPRESENTING DIGITAL WORDS

The present invention relates to a method and apparatus for decoding input symbols representing words including a plurality of information bits. The invention has particular application to the decoding of encoded symbols which have been subjected to phase shift key (PSK) modulation. The invention is advantageously employed in decoding phase shift key modulated signals for digital television signal reception.

BACKGROUND OF INVENTION

Recently, a new class of error-control codes, termed "turbo-codes", has been introduced. These codes provide error performance close to the Shannon limit by using an iterative decoding technique that relies upon simple constituent codes. A natural extension to improve the bandwidth efficiency of turbo-codes is to apply them to trellis coded modulation (TCM) and pragmatic trellis coded modulation (PCTM) systems.

In a known modulation system, a turbo-encoder encodes a serial stream of input data bits at a rate R of 1/3 to produce two parity bits in parallel with each input data bit. The information and parity bits are subject to demultiplexing in a demultiplexer so as to form symbols each of which includes a number of information bits and a number of parity bits. The parity bits are punctured in a puncturing module so as to reduce the number of parity bits and thereby increase the data rate of the system. The bits of each symbol are interleaved in an interleaver and passed to a signal mapping module. The output from the mapping module comprises the I and Q components necessary for input to a PSK modulator.

One of the serious drawbacks associated with the application of turbo-codes is the effect of "flattening error degradation" by which is meant the effect whereby the bit error ratio at the output of the turbo-decoder cannot be reduced below certain values which depend on the type of turbo-code and are in the range of $10^{-8}$ to $10^{-9}$. Although this figure is acceptable for most applications, digital television broadcasting requires quasi-error free performance in which the bit error ratio is $10^{-11}$. In order to meet this requirement, the conventional solution has been the serial concatenation of the Reed Solomon code and a binary turbo-code. However, the concatenated technique is not bandwidth efficient as the turbo-codes are not associated with any trellis coded modulation. Furthermore this technique has not used the full error correction power of the concatenated scheme because it has relied on hard decision information from the turbo-decoder.

It is one aim of the present invention to achieve the desired data rate whilst improving the bit-error ratio.

SUMMARY OF THE INVENTION

According to the present invention, there is now provided decoder apparatus to decode symbols each representing a digital wording comprising a turbo encoded bit, a parity bit and at least one uncoded bit, the apparatus comprising: a first soft metric generator to produce a soft metric of the encoded bit in each symbol; one or more second soft metric generators to generate a soft metric of the uncoded bit in each symbol; a turbo decoder to decode the soft metric of the encoded bit so as to produce a hard value and a soft estimate of the encoded bit; a turbo encoder to encode the hard value of the encoded bit to produce a reconstruction of the encoded bit and two parity bits; a puncture module to puncture the parity bits once; and, one or more hard decision modules to produce a hard decision for the uncoded bit of each symbol.

Further according to the present invention, there is provided a method of decoding symbols each representing a digital word comprising a turbo encoded bit, a parity bit and at least one uncoded bit the method comprising the steps of: producing a soft metric of the encoded bit in each symbol; generating a soft metric of the uncoded bit in each symbol; employing a turbo-decoder to decode the soft metric of the encoded bit so as to produce a hard value and a soft estimate of the encoded bit; employing a turbo encoder to encode the hard value of the encoded bit to produce a reconstruction of the encoded bit and two parity bits, puncturing the parity bits once; and, producing a hard decision for the uncoded bit of each symbol.

BRIEF DESCRIPTION OF THE DRAWINGS

The invention will now be described, by way of example, with reference to the accompanying drawings in which.

DETAIL DESCRIPTION OF THE DRAWINGS

Figure 1:
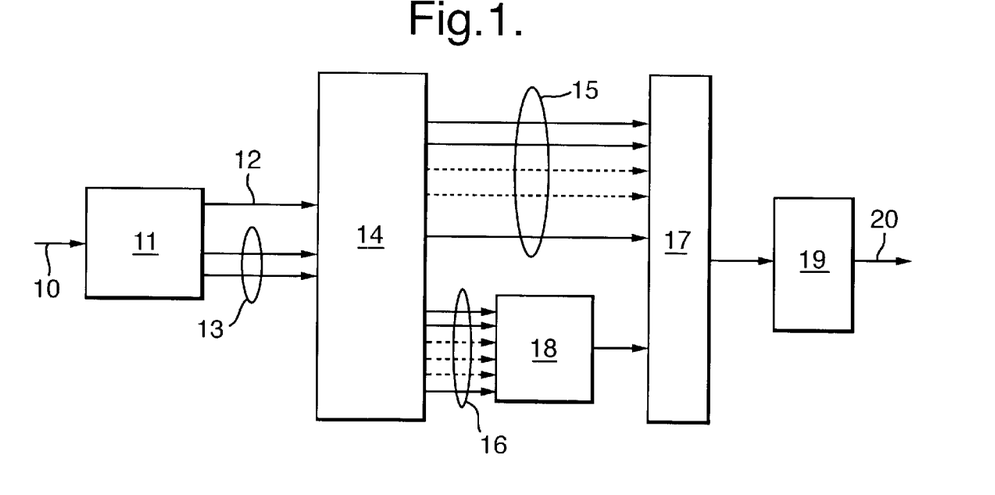
FIG. 1 shows a known form of pragmatic turbo coded modulator.

In FIG. 1, a bitstream of input digital data is applied to an input terminal 10 and is received by a turbo-encoder 11. The turbo-encoder 11 is of the form of any one of a number of known turbo-encoders as described in the literature. The turbo-encoder has a rate R of 1/3 so as to produce one encoded bit on line 12 and two parity bits on parity lines 13 for each of the input bits on line 10.

The encoded bit on line 12 has the same value as the input bit on line 10. The encoded and parity bits from the turbo-encoder 1 1 on lines 12 and 13 are applied to a demultiplexer 14. The demultiplexer 14 converts the turbo-encoded bits from the encoder 11 from serial to parallel form. The parallel output from the demultiplexer 14 includes encoded bits on lines 15 and parity bits on lines 16. The lines 15 and 16 in FIG. 1 are shown in both full lines and dotted lines to indicate that the number of parallel outputs from the demultiplexer 14 is a matter of design choice as will be explained.

The encoded bits on the lines 15 are applied as input bits to an interleaver 17. The parity bits on the lines 16 are applied to a puncturing module 18 which punctures the parity bits so as to reduce the number of parity bits to one. The parity bit that remains following the puncturing operation carried out by the module 18 is applied to the interleaver 17. The interleaver interleaves the encoded and parity bits applied as input thereto and presents the interleaved bits to a signal mapping circuit 19. The mapping circuit 19 maps the digital values represented by the interleaved bits into M-ary symbols which are output on a line 20. The symbols on the line 20 are transmitted as a multilevel digital signal which is applied to modulate an output carrier transmission.

It will be seen from the known modulation scheme of FIG. 1 that two parity bits are generated for each encoded information bit which is received by the input terminal 10. Consequently, where the output modulation is 8-PSK, and there are 2 information bits and one parity bit per symbol, the known scheme requires the puncturing of 3 parity bits. Alternatively, where the output modulation is 16-PSK and there are 3 information bits and one parity bit per symbol, the known scheme requires the puncturing of 5 parity bits. The number of lines 15 and 16 in FIG. 1 will thus depend on the number of bits per symbol in the output modulation.

Figure 2:
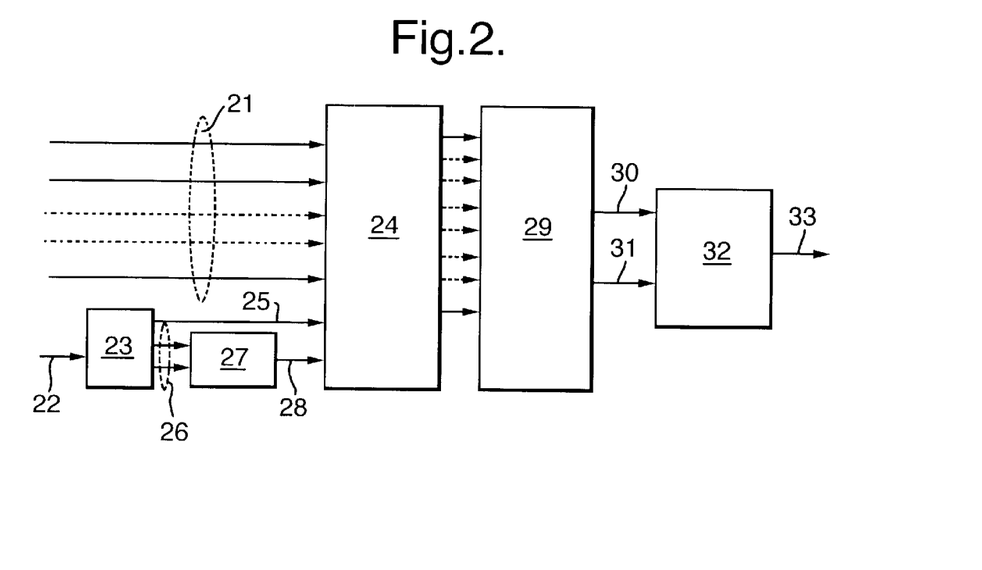
FIG. 2 is a generic diagram of a pragmatic turbo coded modulator included in transmission apparatus according to the present invention.

In FIG. 2, there is shown a modulator apparatus having a set of input terminals 21 together with an additional input terminal 22. The input terminals 21 and 22 together constitute the required number of parallel input terminals to receive an input word of k information bits. The input terminal 22 is connected to supply one bit of each input word to a turbo-encoder 23 and the input terminals 21 are connected to supply the remaining information bits to an interleaver 24. The particular number of input terminals 21 depends on the word size of each input word and the input lines 21 are shown in both full lines and dotted lines to indicate that this number is a matter of design choice.

The turbo encoder 23 has a rate of 1/3 and produces one encoded information bit on a line 25 and two parity bits on lines 26. The parity bits are punctured once by means of a puncturing module 27 to produce a parity bit on an output line 28 from the puncturing module 27. The lines 25 and 28 are connected in parallel with the input lines 21 to provide inputs to the interleaver 24. The interleaver 24 interleaves the uncoded information bits on the lines 21 with the encoded information bit on the line 25 and the parity bit on the line 28. The interleaver 24 passes the interleaved bits to a bit mapping circuit 29 which converts the interleaved bits to a symbol representing k information bits and one parity bit. The symbol is represented by I and Q component values on lines 30 and 31 which are passed to a M-ary modulator 32 from which a modulated carrier signal is transmitted on an output line 33. It will be observed that the apparatus shown in FIG. 2 uses only one standard turbo-encoder having a rate R=1/3 but the number of punctured bits has been reduced compared to the prior art arrangement. This has the benefit of improved error performance and reduced implementation complexity and cost.

Figure 3:
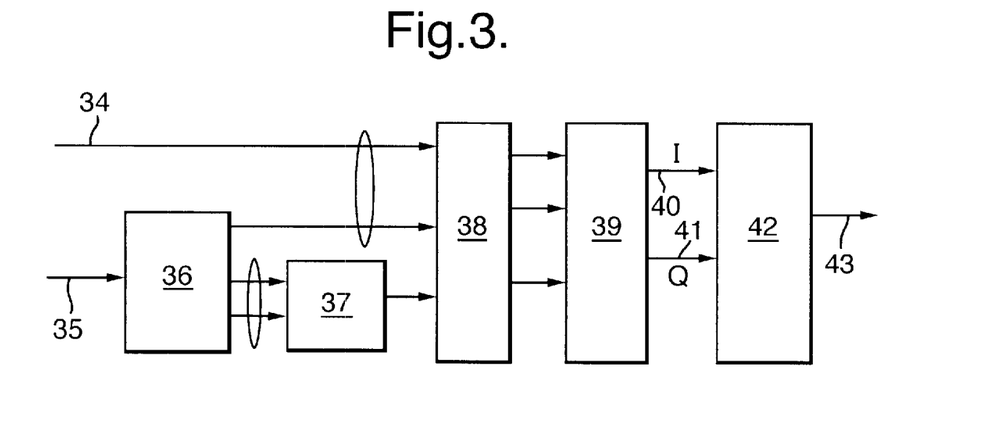
FIG. 3 shows the modulator of FIG. 2 adapted for 8-PSK modulation.

FIG. 3 shows how the apparatus of FIG. 2 can be adapted for the specific case where the output modulation is 8-PSK modulation. In FIG. 3, an input line 34 and an input line 35 each receive a respective information bit of a 2-bit input word. The input line 35 is connected to a turbo-encoder 36 which has a rate R of 1/3 and therefore generates one encoded information bit and two parity bits. The parity bits are punctured by means of a puncturing module 37.

For each input word, an interleaver 38 receives one uncoded information bit on the line 34, an encoded information bit from the turbo encoder 36 and a parity bit from the puncturing module 37. The interleaver 38 interleaves the received bits to form a 3-bit input word which is supplied to a bit mapping circuit 39. The bit mapping circuit converts the received bits to a symbol representing 2 information bits and one parity bit. The symbol is represented by I and Q component values on lines 40 and 41 which are passed to a 8-PSK modulator 42 from which a modulated carrier signal is transmitted on an output line 43.

Figure 4:
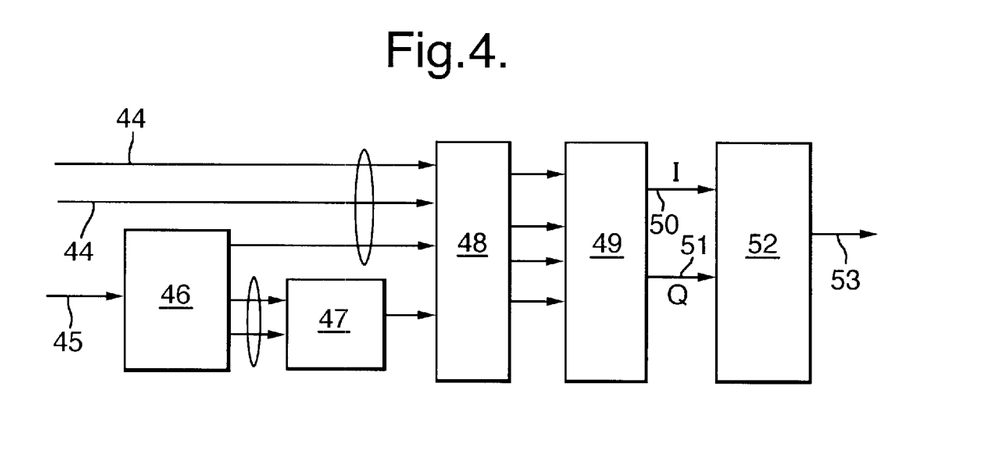
FIG. 4 shows the modulator of FIG. 2 adapted for 16-PSK modulation.

FIG. 4 shows how the apparatus of FIG. 2 can be adapted for the specific case where the output modulation is 16-PSK modulation. In FIG. 4, input lines 44 receive 2 information bits and an input line 45 receives one information bit of a 3-bit input word. The input line 45 is connected to a turbo-encoder 46 which has a rate R of 1/3 and therefore generates one encoded information bit and two parity bits. The parity bits are punctured by means of a puncturing module 47.

For each input word, an interleaver 48 receives two uncoded information bits on the lines 44, an encoded information bit from the turbo encoder 46 and a parity bit from the puncturing module 47. The interleaver 48 interleaves the received bits to form a 4-bit input word which is supplied to a bit mapping circuit 49. The bit mapping circuit converts the received bits to a symbol representing 3 information bits and one parity bit. The symbol is represented by I and Q component values on lines 50 and 51 which are passed to a 16-PSK modulator 52 from which a modulated carrier signal is transmitted on an output line 53.

A receiver apparatus will now be described with reference to FIG. 5 in which one R=1/2 turbo-decoder and one R=1/3 punctured encoder are used to reconstruct the transmitted data. Unlike prior art techniques, the receiver apparatus generates soft reliability values for all the coded and uncoded bits and thus it becomes possible to adopt a concatenated scheme which is enhanced by the implementation of a soft-in-soft-out decoder concatenated with a soft decision Reed-Solomon decoder.

Figure 5:
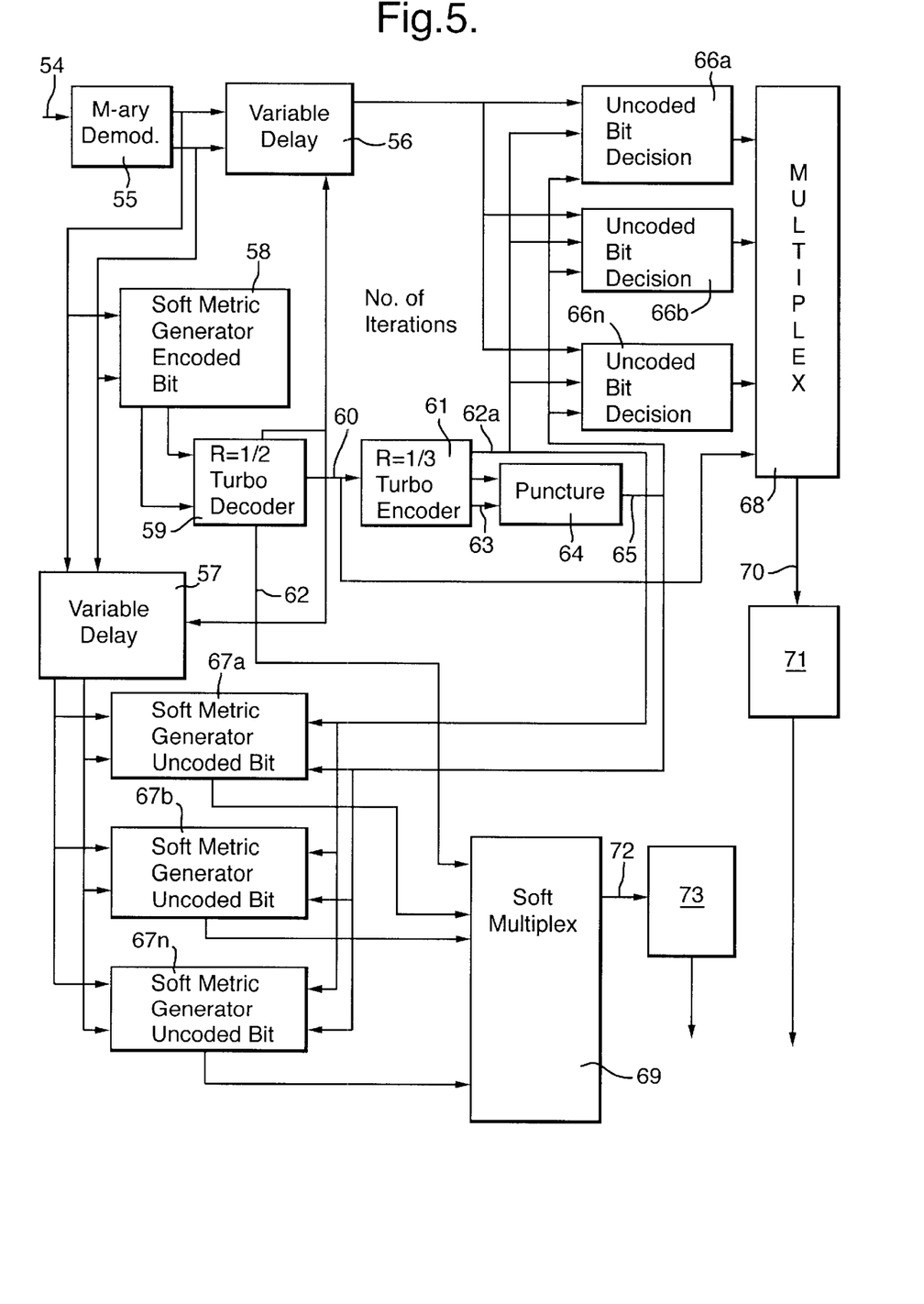
FIG. 5 is a generic diagram of a decoder to decode symbols encoded by the modulator of FIG. 2.

In FIG. 5, a receiver apparatus is adapted to receive the modulated carrier signal transmitted from the modulator output terminal 33 of FIG. 2. The modulated carrier signal is received at a receiver input terminal 54 in FIG. 5. The input terminal 54 is connected to a M-ary demodulator 55 which reconstructs the I and Q component values of each symbol transmitted to the receiver. The I and Q values are passed to first and second variable delays 56 and 57 and to a soft metric generator 58. The soft metric generator 58 generates soft decision values for the encoded information bit in each symbol transmitted to the receiver. The soft decision values are passed from the generator 58 to a turbo-decoder 59 of known form having a rate R=1/2. The decoder 59 has a latency signified by the number of iterations used in calculating hard decision and soft decision estimates of the encoded information bit. The hard decision is transmitted on a line 60 to a turbo-encoder 61 while the soft decision appears on a line 62. The number of iterations of the decoder 59 is signalled to the variable delays 56 and 57 to control the delay imposed by each.

The turbo-encoder 61 has a rate R=1/3 and therefore generates an encoded information bit on an output line 62a and two parity bits on lines 63. The parity bits from the encoder 61 are applied to a puncturing module 64 which punctures the parity bits once so as to provide a single parity bit on a line 65. The encoded information bit and the parity bit produced by the encoder 61 are applied to a set of hard bit decision modules 66a, 66b . . . 66n and a set of soft metric generators 67a, 67b . . . 67n. The hard bit decision modules 66 receive the output from the delay 56 and provide hard decisions for each of the uncoded bits in the symbols transmitted to the receiver. The decision module 66a provides an output decision signal representing the first uncoded information bit in an incoming symbol. The decision module 66b provides an output signal representing the second uncoded information bit in an incoming symbol and the decision module 66n provides an output signal representing the nth uncoded bit in an incoming symbol. The number of decision modules 66 will depend on the number of uncoded information bits that the receiver is expected to receive in the symbols transmitted to it. The outputs from the decision modules 66 are connected to a hard decision multiplexer 68.

The soft metric generators 67 receive the output from the delay 57 and provide soft decisions for each of the uncoded bits in the symbols transmitted to the receiver. The metric generator 67a provides an output soft value for the first uncoded information bit in an incoming symbol. The metric generator 67b provides an output soft value for the second uncoded information bit in an incoming symbol and the metric generator 67n provides an output soft value representing the nth uncoded bit in an incoming symbol. The soft values are each represented by a m-tuple (where m≧2) and the number of metric generators 67 will depend on the number of uncoded information bits that the receiver is expected to receive in the symbols transmitted to it. The outputs from the metric generators 67 are connected to a soft multiplexer 69 which also operates with m-tuples rather than with bits.

The hard multiplexer 68 multiplexes the uncoded information bit decisions from the modules 66 with the coded information bit supplied by the turbo-decoder on the line 60 to produce a multiplexed bit stream on an output line 70. The output line 70 is connected to pass the multiplexed bit stream to a hard decision interleaver 71 prior to a hard decision outer decoder (which may be a Reed-Solomon decoder).

The soft multiplexer 69 multiplexes the soft values which are estimates of the uncoded information bits from the generators 67 with the soft estimate supplied by the turbo-decoder 59 on the line 62 to produce a multiplexed signal on an output line 72. The output line 72 is connected to pass the multiplexed signal through a soft interleaver 73, which operates in m-tuples, to a soft or erasure Reed Solomon decoder.

Figure 6:
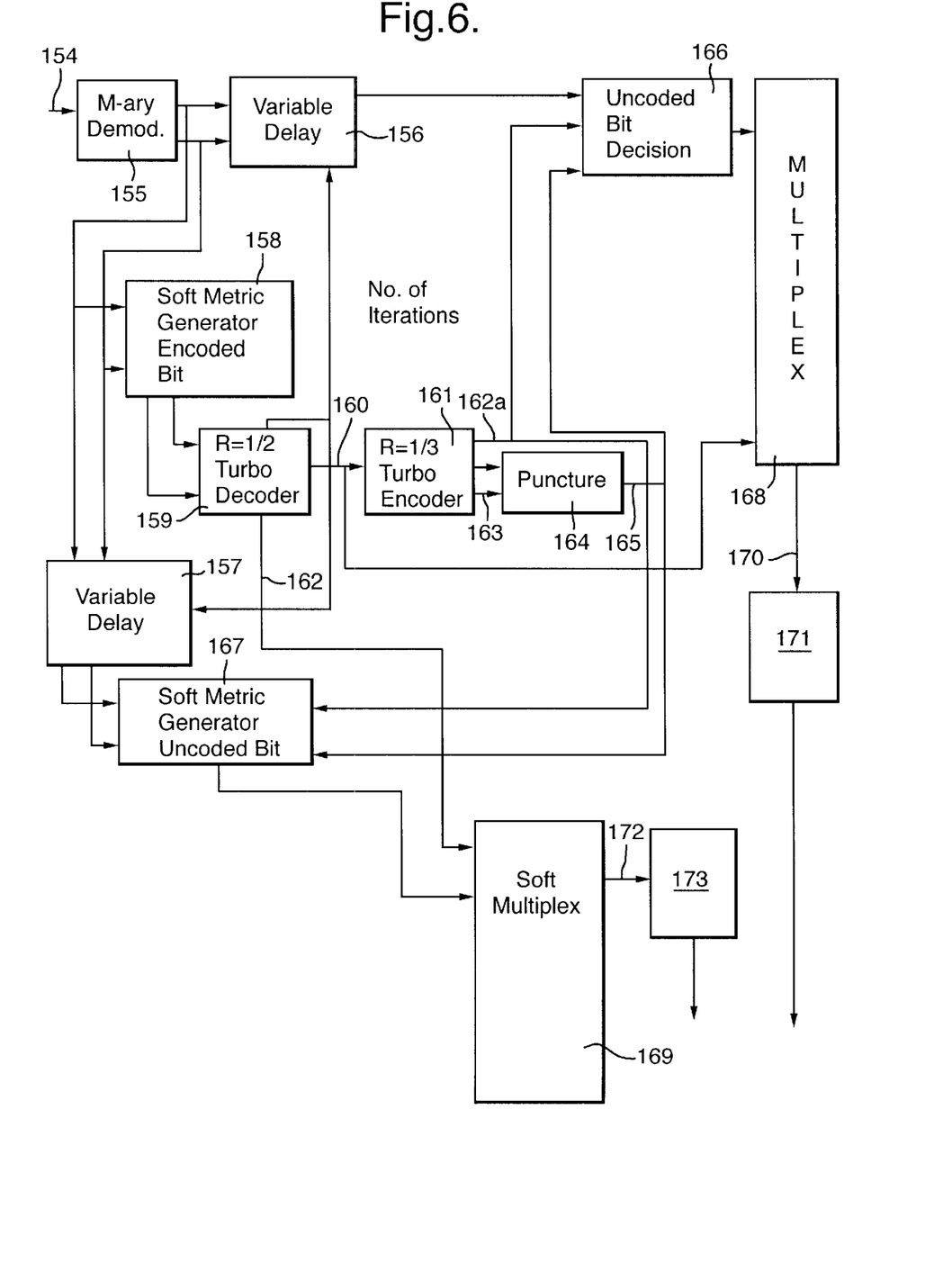
FIG. 6 shows a decoder to decode symbols encoded by the modulator of FIG. 3, and, FIG. 7 shows a decoder to decode symbols encoded by the modulator of FIG. 4.

FIG. 6 shows how the apparatus of FIG. 5 can be adapted for the specific case where the input signal received by the receiver is an 8-PSK modulated signal. The modulated carrier signal is received at a receiver input terminal 154 in FIG. 6. The input terminal 154 is connected to an 8-PSK demodulator 155 which reconstructs the I and Q component values of each symbol transmitted to the receiver. The I and Q values are passed to first and second variable delays 156 and 157 and to a soft metric generator 158. The soft metric generator 158 generates soft decision values for the encoded information bit in each symbol transmitted to the receiver. The soft decision values are passed from the generator 158 to a turbo-decoder 159 of the same form as the decoder 59 in FIG. 5. The hard decision from the decoder 159 is transmitted on a line 160 to a turbo-encoder 161 while the soft decision appears on a line 162. The number of iterations of the decoder 159 is signalled to the variable delays 156 and 157 to control the delay imposed by each.

The turbo-encoder 161 has a rate R=1/3 and therefore generates an encoded information bit on an output line 162a and two parity bits on lines 163. The parity bits from the encoder 161 are applied to a puncturing module 164 which punctures the parity bits once so as to provide a single parity bit on a line 165. The encoded information bit and the parity bit produced by the encoder 161 are applied to a hard bit decision module 166 and a soft metric generator 167. The hard bit decision module 166 receives the output from the delay 156 and provides a hard decision output for the uncoded bit in each of the 8-PSK symbols transmitted to the receiver. The output from the decision module 166 is connected to a hard decision multiplexer 168.

The soft metric generator 167 receives the output from the delay 157 and provides a soft decision for the uncoded bit in each of the 8-PSK symbols transmitted to the receiver. The soft values from the generator 167 are each represented by a m-tuple (where m≧2) and supplied to a soft multiplexer 169 which also operates with m-tuples rather than with bits.

The hard multiplexer 168 multiplexes the uncoded information bit decisions from the module 166 with the coded information bit supplied by the turbo-decoder on the line 160 to produce a multiplexed bit stream on an output line 170. The output line 170 is connected to pass the multiplexed bit stream to a hard decision interleaver 171 prior to a hard decision outer decoder (which may be a Reed-Solomon decoder).

The soft multiplexer 169 multiplexes the soft values from the generator 167 with the soft estimate supplied by the turbo-decoder 159 on the line 162 to produce a multiplexed signal on an output line 172. The output line 172 is connected to pass the multiplexed signal through a soft interleaver 173 to a soft or erasure Reed Solomon decoder.

Figure 7:
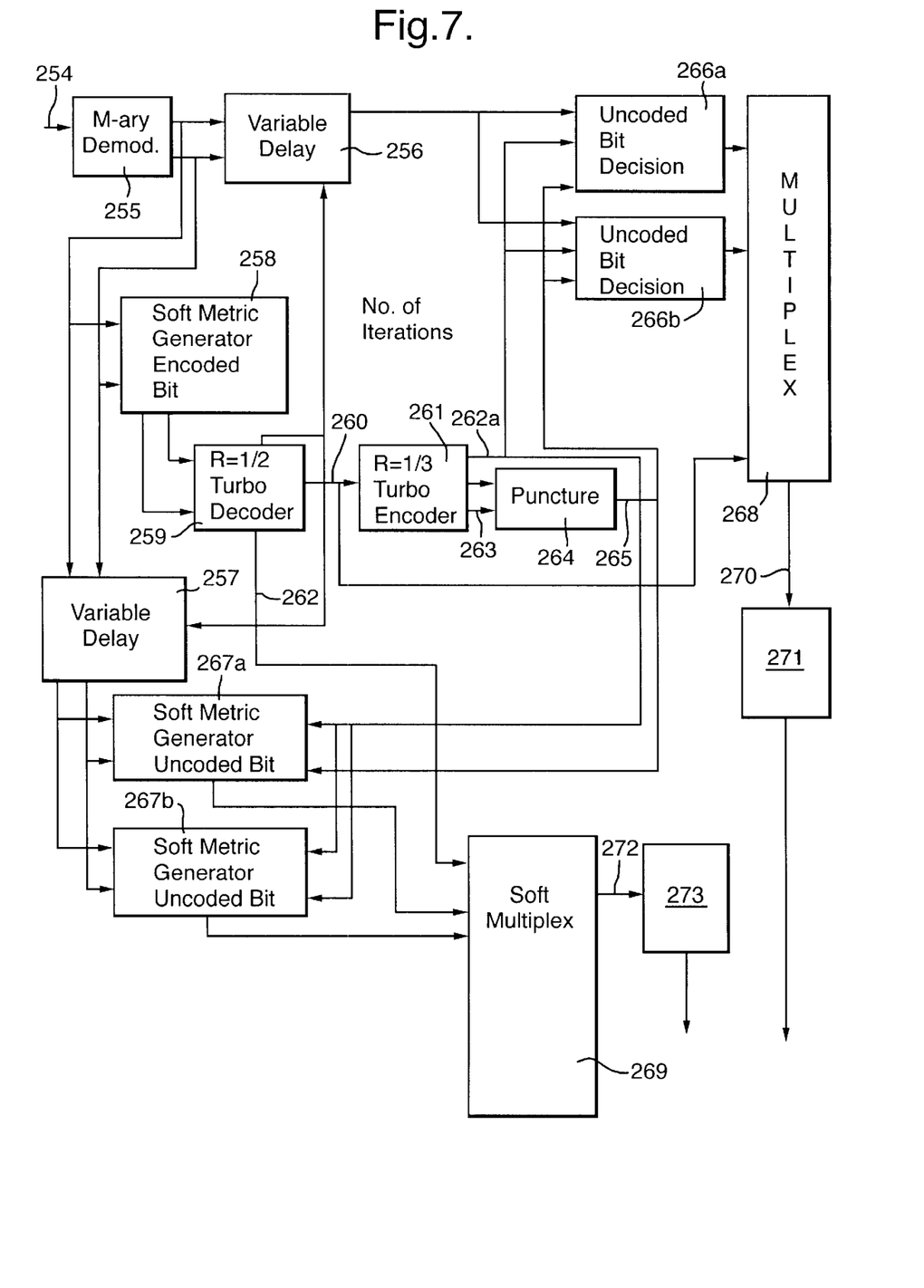

FIG. 7 shows how the apparatus of FIG. 5 can be adapted for the specific case where the input signal received by the receiver is a 16-PSK modulated signal. The modulated carrier signal is received at a receiver input terminal 254 in FIG. 7. The input terminal 254 is connected to a 16-PSK demodulator 255 which reconstructs the I and Q component values of each symbol transmitted to the receiver. The I and Q values are passed to first and second variable delays 256 and 257 and to soft metric generators 258. The soft metric generator 258 generates soft decision values for the encoded information bit in each symbol transmitted to the receiver. The soft decision values are passed from the generator 258 to a turbo-decoder 259 of the same form as the decoder 59 in FIG. 5. The hard decision from the decoder 259 is transmitted on a line 260 to a turbo-encoder 261 while the soft decision appears on a line 262. The number of iterations of the decoder 259 is signalled to the variable delays 256 and 257 to control the delay imposed by each.

The turbo-encoder 261 has a rate R=1/3 and therefore generates an encoded information bit on an output line 262a and two parity bits on lines 263. The parity bits from the encoder 261 are applied to a puncturing module 264 which punctures the parity bits once so as to provide a single parity bit on a line 265. The encoded information bit and the parity bit produced by the encoder 261 are applied to hard bit decision modules 266a and 266b and soft metric generators 267a and 267b. The hard bit decision modules 266a and 266b receive the output from the delay 256 and provide hard decision outputs for the two uncoded bits in each of the 16-PSK symbols transmitted to the receiver. The outputs from the decision modules 266a and 266b are connected to a hard decision multiplexer 268.

The soft metric generators 267a and 267b receive the output from the delay 257 and provide soft decisions for the two uncoded bits in each of the 16-PSK symbols transmitted to the receiver. The soft values from the generators 267a and 267b are each represented by a m-tuple (where m≧2) and supplied to a soft multiplexer 269 which also operates with m-tuples rather than with bits.

The hard multiplexer 268 multiplexes the uncoded information bit decisions from the modules 266a and 266b with the coded information bit supplied by the turbo-decoder on the line 260 to produce a multiplexed bit stream on an output line 270. The output line 270 is connected to pass the multiplexed bit stream to a hard decision interleaver 271 prior to a hard decision outer decoder (which may be a Reed-Solomon decoder).

The soft multiplexer 269 multiplexes the soft values from the generators 267a and 267b with the soft estimate supplied by the turbo-decoder 259 on the line 262 to produce a multiplexed signal on an output line 272. The output line 272 is connected to pass the multiplexed signal through a soft interleaver 273 to a soft or erasure Reed Solomon decoder.

What has been described is a method and apparatus for providing the data rate desired for signal transmissions such as those encountered in digital television transmissions in a transmission system operating with a reduced number of punctured parity bits. Flexibility is provided to accommodate 8-PSK or 16-PSK transmissions. It will be understood that the invention is not limited to phase shift key modulation and that any suitable form of modulation can be applied to the signal transmissions such as 16-QAM modulation for example.

What is claimed is:

1. Decoder apparatus to decode symbols each representing a digital wording comprising a turbo encoded bit, a parity bit and at least one uncoded bit, the apparatus comprising: a first soft metric generator to produce a soft metric of the encoded bit in each symbol; one or more second soft metric generators to generate a soft metric of the uncoded bit in each symbol; a turbo decoder to decode the soft metric of the encoded bit so as to produce a hard value of the encoded bit to produce a reconstruction of the encoded bit and two parity bits; a puncture module to puncture the parity bits once; and, one or more hard decision modules to produce a hard decision for the uncoded bit of each symbol.

2. Decoder apparatus according to claim 1, adapted to decode symbols which are 8-PSK symbols comprising one uncoded bit, one encoded bit and one parity bit.

3. Decoder apparatus according to claim 1 adapted to decode symbols which are 16-PSK symbols comprising two uncoded bits, one encoded bit and one parity bit.

4. Signal transmission system comprising an encoder apparatus to encode input digital words of information bits so as to produce symbols representing the digital words and decoding apparatus to decode the symbols, the encoder apparatus comprising: a turbo encoder to receive and encode a first portion of each input digital word so as to generate corresponding encoded and parity bits; a puncturing module to puncture the parity bits once for each encoded bit; and a mapping circuit to receive an uncoded second portion of each input word, the mapping circuit being adapted to form an output symbol for each input word from the uncoded second portion and from the corresponding encoded and puncture parity bits, and a decoding apparatus being as claimed in claim 1.

5. A method of decoding symbols each representing a digital word comprising a turbo encoded bit, a parity bit and at least one uncoded bit the method comprising the steps of: producing a soft metric of the encoded bit in each symbol; generating a soft metric of the uncoded bit in each symbol; employing a turbo-decoder to decode the soft metric of the encoded bit so as to produce a hard value and a soft estimate of the encoded bit; employing a turbo encoder to decode the hard value of the encoded bit to produce a reconstruction of the encoded bit and two parity bits, puncturing the parity bits once; and, producing a hard decision for the uncoded bit of each symbol.

6. A method according to claim 5, applied to decoding symbols which are 8-PSK symbols comprising one uncoded bit, one encoded bit and one parity bit.

7. A method according to claim 5, applied to decoding symbols which are 16-PSK symbols comprising two uncoded bits, one encoded bit and one parity bit.

8. A method of transmitting and receiving signals, the method comprising an encoding stage for encoding input digital words of information bits so as to produce symbols representing the input digital words and a decoding stage for decoding the symbols, the encoding stage comprising the steps of: employing a turbo encoder to retrieve and encode a first portion of each input word so as to generate corresponding encoded and parity bits; puncturing the parity bits once for each encoded bit and forming an output symbol for each input word from an uncoded second portion of the input word and from the corresponding encoded and punctured parity bits; and a decoding stage being as claimed in claim 5.

* * * * *

UNITED STATES PATENT AND TRADEMARK OFFICE
CERTIFICATE OF CORRECTION

PATENT NO. : 6,611,940 B1
DATED : August 26, 2003
INVENTOR(S) : Garegin Mrkarian and Keith Pickavance It is certified that error appears in the above-identified patent and that said Letters Patent is hereby corrected as shown below:

<u>Column 1,</u>
Lines 60 and 67, please delete "the" and insert -- said at least one --, therefor.

<u>Column 2,</u>
Lines 6 and 12, please delete "the" and insert -- said at least one --, therefor.

<u>Column 7,</u>
Lines 21 and 27, please delete "the" and insert -- said at least one --, therefor.

<u>Column 8,</u>
Lines 12 and 18, please delete "the" and insert -- said at least one --, therefor.

Signed and Sealed this

Sixteenth Day of March, 2004

JON W. DUDAS
*Acting Director of the United States Patent and Trademark Office*